(12) United States Patent
Ishida

(10) Patent No.: US 12,324,117 B2
(45) Date of Patent: Jun. 3, 2025

(54) SECURING COMPONENT AND ELECTRONIC DEVICE

(71) Applicant: KYOCERA Corporation, Kyoto (JP)

(72) Inventor: Arata Ishida, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 18/615,037

(22) Filed: Mar. 25, 2024

(65) Prior Publication Data
US 2024/0334618 A1 Oct. 3, 2024

(30) Foreign Application Priority Data
Mar. 27, 2023 (JP) .................................. 2023-050672

(51) Int. Cl.
*H05K 5/10* (2025.01)
*H05K 5/02* (2006.01)

(52) U.S. Cl.
CPC ............. *H05K 5/10* (2025.01); *H05K 5/0221* (2013.01)

(58) Field of Classification Search
CPC ...... H05K 5/0004; H05K 5/0221; H05K 5/10; H05K 5/02; H01H 3/12; H01H 3/122; H01H 13/02; H01H 13/14; H01H 13/50; H01H 13/52; H01H 13/85; H01H 2227/028
See application file for complete search history.

(56) References Cited

U.S. PATENT DOCUMENTS

| 8,283,587 B2* | 10/2012 | Ouyang | H04M 1/0202 200/345 |
| 8,427,345 B2* | 4/2013 | Shi | H01H 13/70 200/341 |
| 8,848,348 B2* | 9/2014 | Fujimura | G06F 1/1656 361/679.01 |
| 10,353,437 B1 | 7/2019 | Kitamura et al. | |

FOREIGN PATENT DOCUMENTS

JP 2019-185241 A 10/2019

* cited by examiner

*Primary Examiner* — Lheiren Mae A Caroc
(74) *Attorney, Agent, or Firm* — Studebaker Brackett PLLC

(57) ABSTRACT

A securing component includes a securing section secured to a member, a through-hole into which a pusher of a key component is inserted, a first end and a second end, a first slit, and a second slit. The first end and the second end extend in a first direction from the through-hole. The first direction extends toward the securing section. The first end is opposite to the second end through the through-hole. The first slit extends in a second direction from the first end. The second direction crosses the first direction. The second slit extends in the second direction from the second end. The first slit and the second slit are disposed between the through-hole and the securing section, the first slit being next to the second slit.

12 Claims, 8 Drawing Sheets

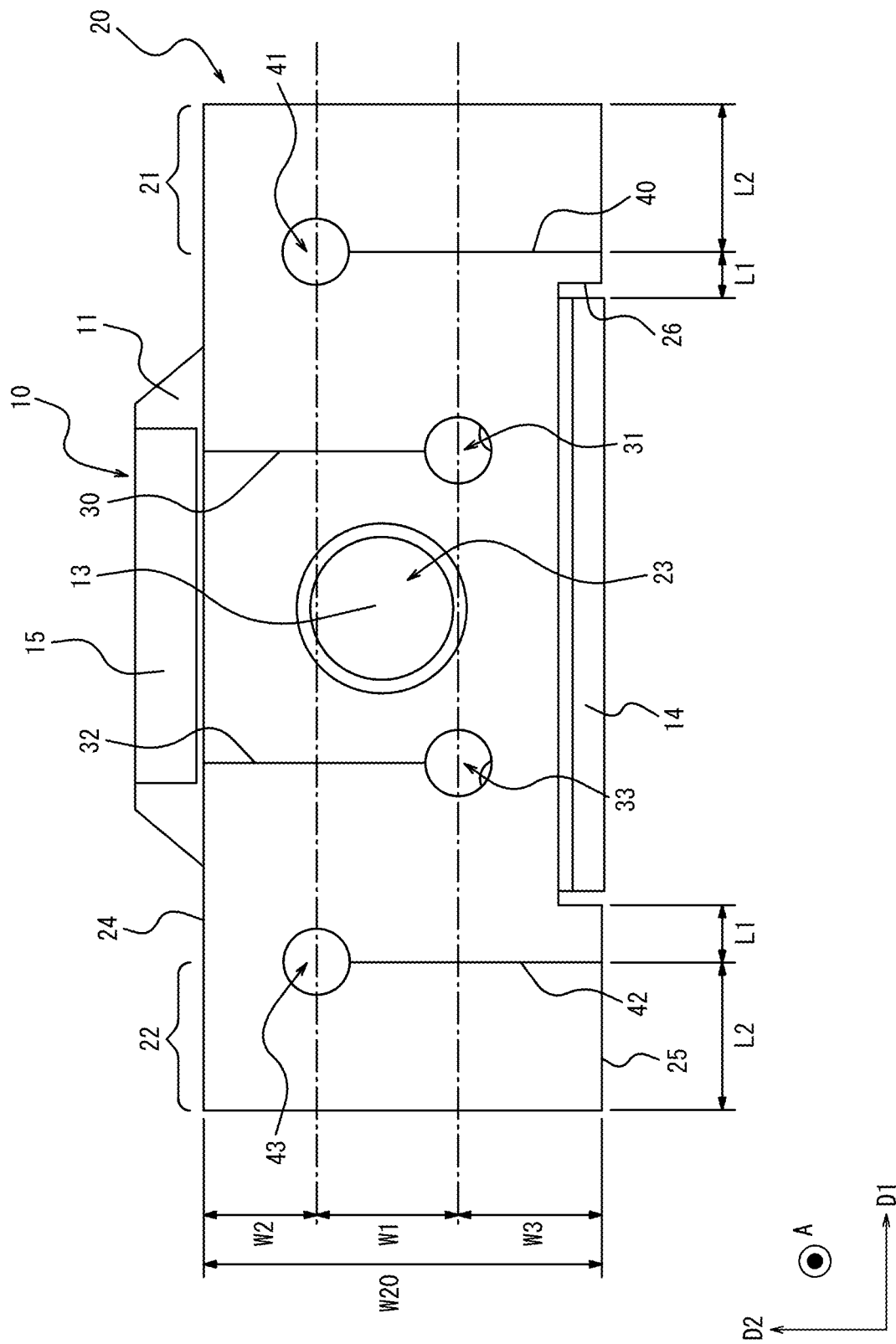

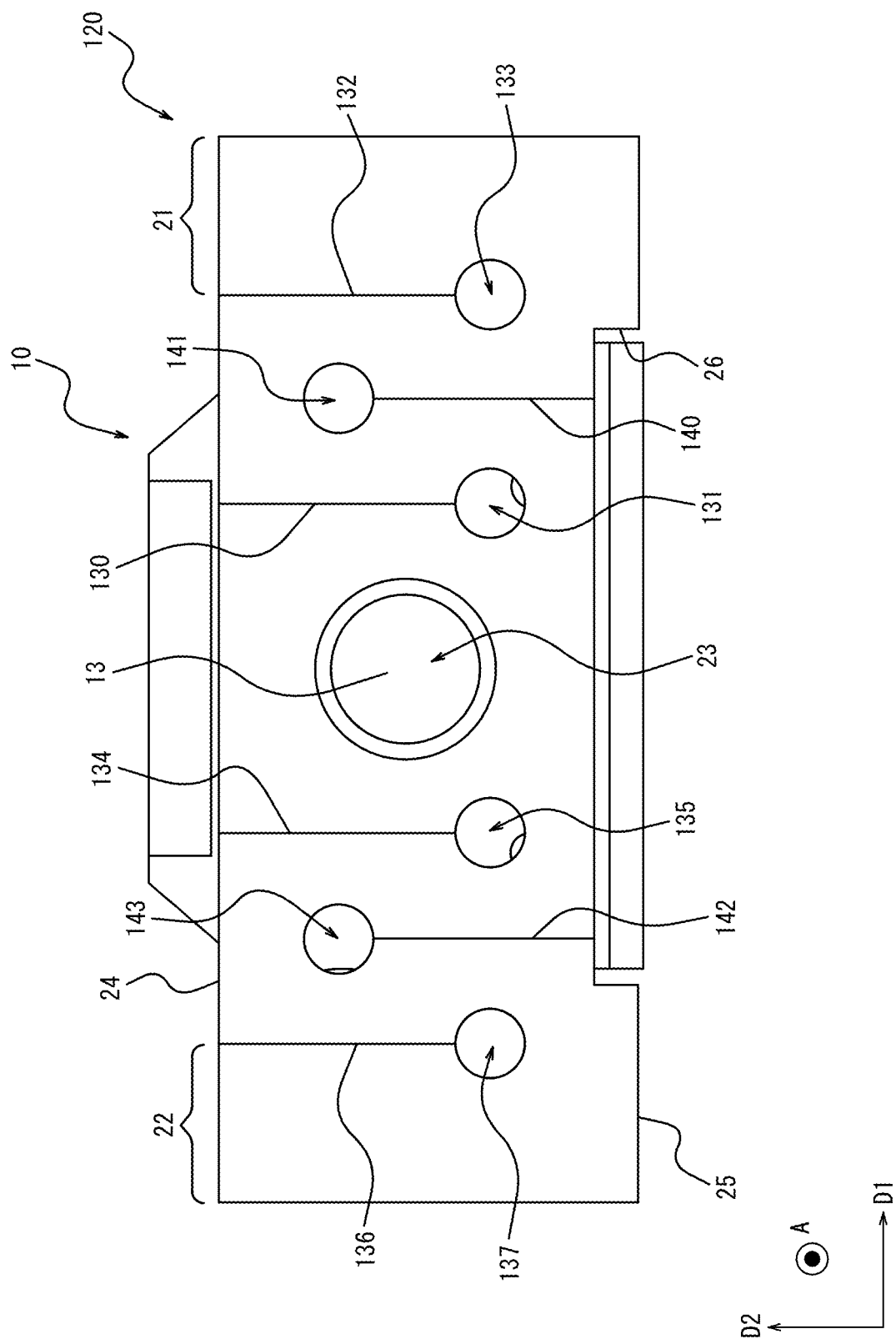

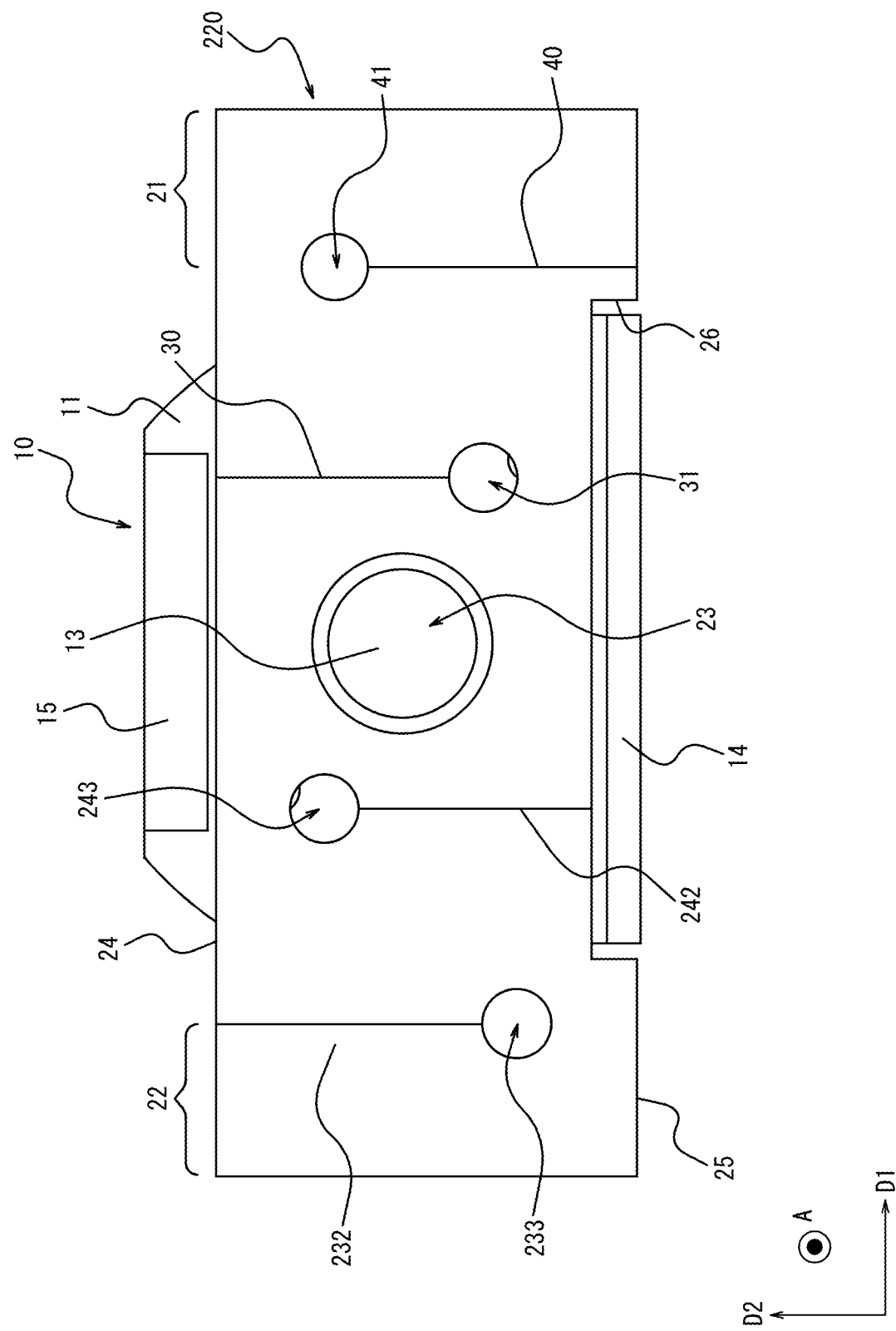

SECURING COMPONENT AND ELECTRONIC DEVICE

CROSS REFERENCES TO RELATED APPLICATIONS

The present invention contains subject matter related to Japanese Patent Application No. 2023-050672 filed in the Japan Patent Office on Mar. 27, 2023, the entire contents of which are incorporated herein by reference.

BACKGROUND OF THE INVENTION

1. Field of the Invention

The present disclosure relates to securing components and electronic devices.

2. Description of the Related Art

Known technology in the related art involves securing a physical key. For example, Japanese Unexamined Patent Application Publication No. 2019-185241 describes a plate spring. The plate spring described in Japanese Unexamined Patent Application Publication No. 2019-185241 is provided with a hook member that is engageable with an engagement hole provided in a keyboard device.

SUMMARY OF THE INVENTION

In an embodiment of the present disclosure, a securing component includes a securing section, a through-hole, a first end and a second end, a first slit, and a second slit. The securing section is secured to a member. In the through-hole, a pusher of a key component is inserted. The first end and the second end extend in a first direction from the through-hole. The first direction extends toward the securing section. The first end is opposite to the second end through the through-hole. The first slit extends in a second direction from the first end. The second direction intersects the first direction. The second slit extends in the second direction from the second end. The first slit and the second slit are disposed between the through-hole and the securing section, the first slit being next to the second slit.

In an embodiment of the present disclosure, an electronic device includes a securing component. The securing component includes a securing section, a through-hole, a first end and a second end, a first slit, and a second slit. The securing section is secured to a member. In the through-hole, a pusher of a key component is fitted. The first end and the second end extend in a first direction from the through-hole. The first direction extends toward the securing section. The first end and the second end are disposed with the through-hole interposed therebetween. The first slit extends in a second direction from the first end. The second direction intersects the first direction. The second slit extends in the second direction from the second end. The first slit and the second slit are adjacent to each other between the through-hole and the securing section.

BRIEF DESCRIPTION OF THE DRAWINGS

FIG. 6 is a top view of a key component and a securing component illustrated in FIG. 2;

FIG. 7 is a top view of a securing component according to a first modification of the present disclosure; and FIG. 8 is a top view of a securing component according to a second modification of the present disclosure.

DESCRIPTION OF THE PREFERRED EMBODIMENTS

The technology in the related art for securing a physical key has room for improvement. An embodiment of the present disclosure can improve the technology for securing a physical key.

An embodiment according to the present disclosure will be described below with reference to the drawings. In the following embodiment, an electronic device according to the present disclosure is described as being a smartphone. However, the electronic device according to the present disclosure may be any electronic device so long as the electronic device can employ a key component and a securing component according to the present disclosure.

Figure 1:
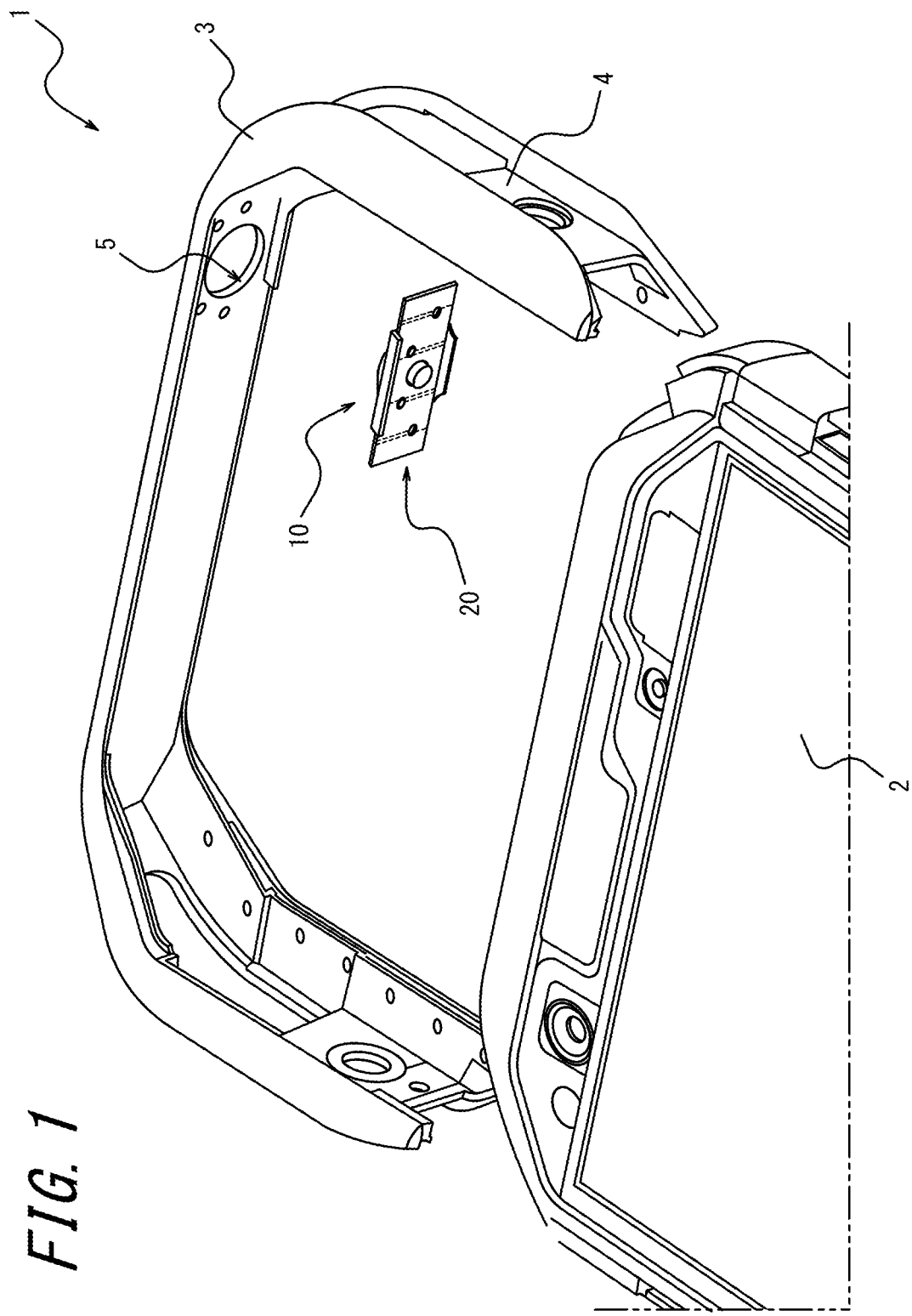
FIG. 1 is an exploded view of an electronic device according to an embodiment of the present disclosure.

As illustrated in FIG. 1, an electronic device 1 according to this embodiment includes a main body 2, a cover member 3, a casing member 4, an opening 5, a key component 10, and a securing component 20.

The main body 2 accommodates therein various electronic components of the electronic device 1. The cover member 3 and the casing member 4 are attached to the main body 2. The cover member 3 protects the main body 2 from an external impact. The casing member 4 is attached to the inner side of the cover member 3. The opening 5 is located in the cover member 3 and the casing member 4.

Figure 2:
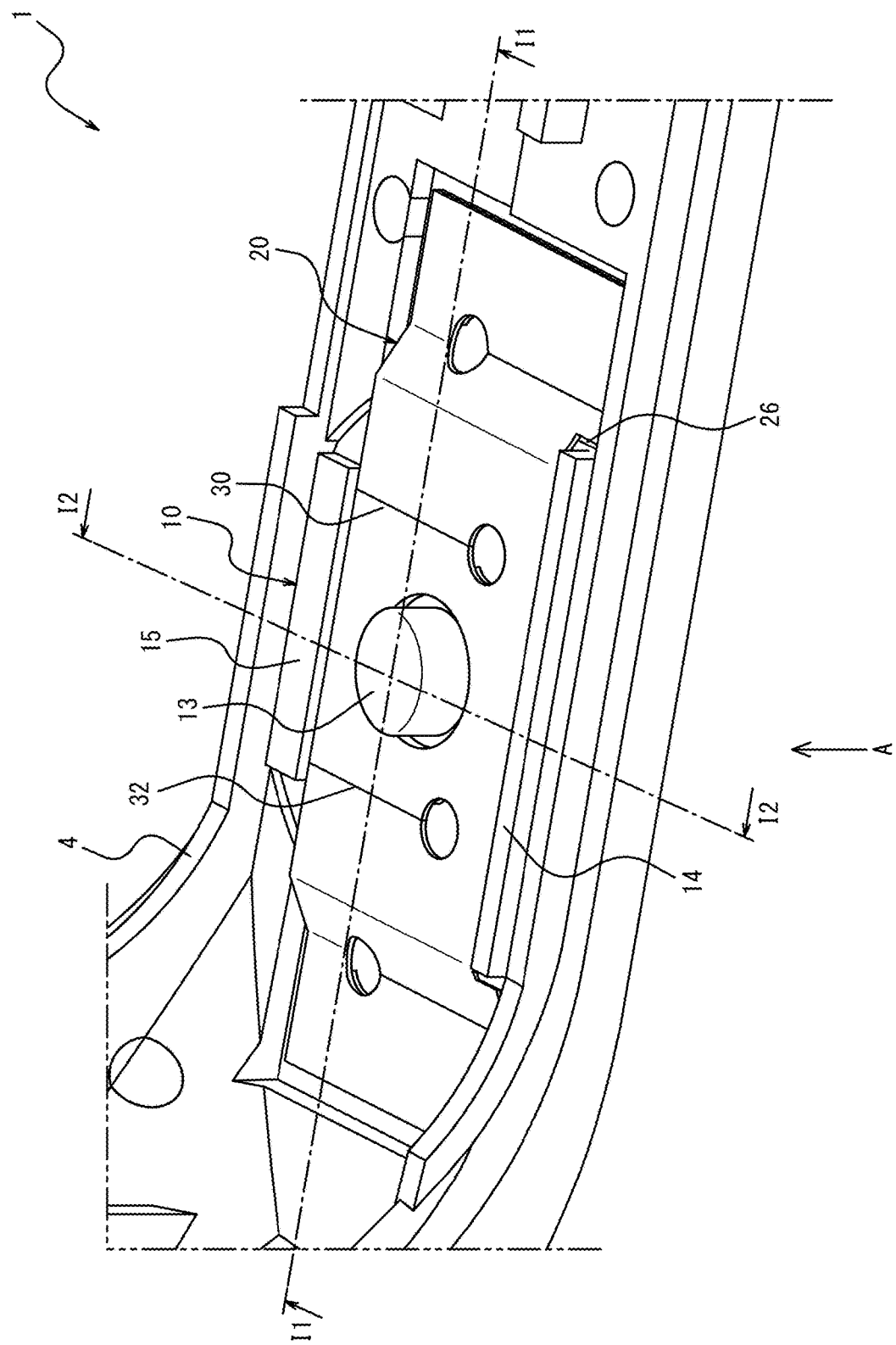
FIG. 2 is a partially enlarged view of the electronic device illustrated in FIG. 1.

The key component 10 is pressed by a user. When the key component 10 is pressed by the user, the key component 10 moves in the direction of an arrow A, as illustrated in FIG. 2. The key component 10 may be composed of a resin material, such as polyethylene terephthalate (PET), polycarbonate (PC), or the like.

As illustrated in FIG. 2, the securing component 20 secures the key component 10 to the casing member 4. The securing component 20 secures the key component 10 such that the key component 10 is movable by a predetermined stroke amount in the direction of the arrow A. When the key component 10 moves in the direction of the arrow A, the securing component 20 receives stress in the direction of the arrow A. When the securing component 20 receives stress in the direction of the arrow A, the securing component 20 deforms. The securing component 20 has a thin tabular shape. The securing component 20 is composed of a resin material, such as PET, PC, or the like.

Figure 3:
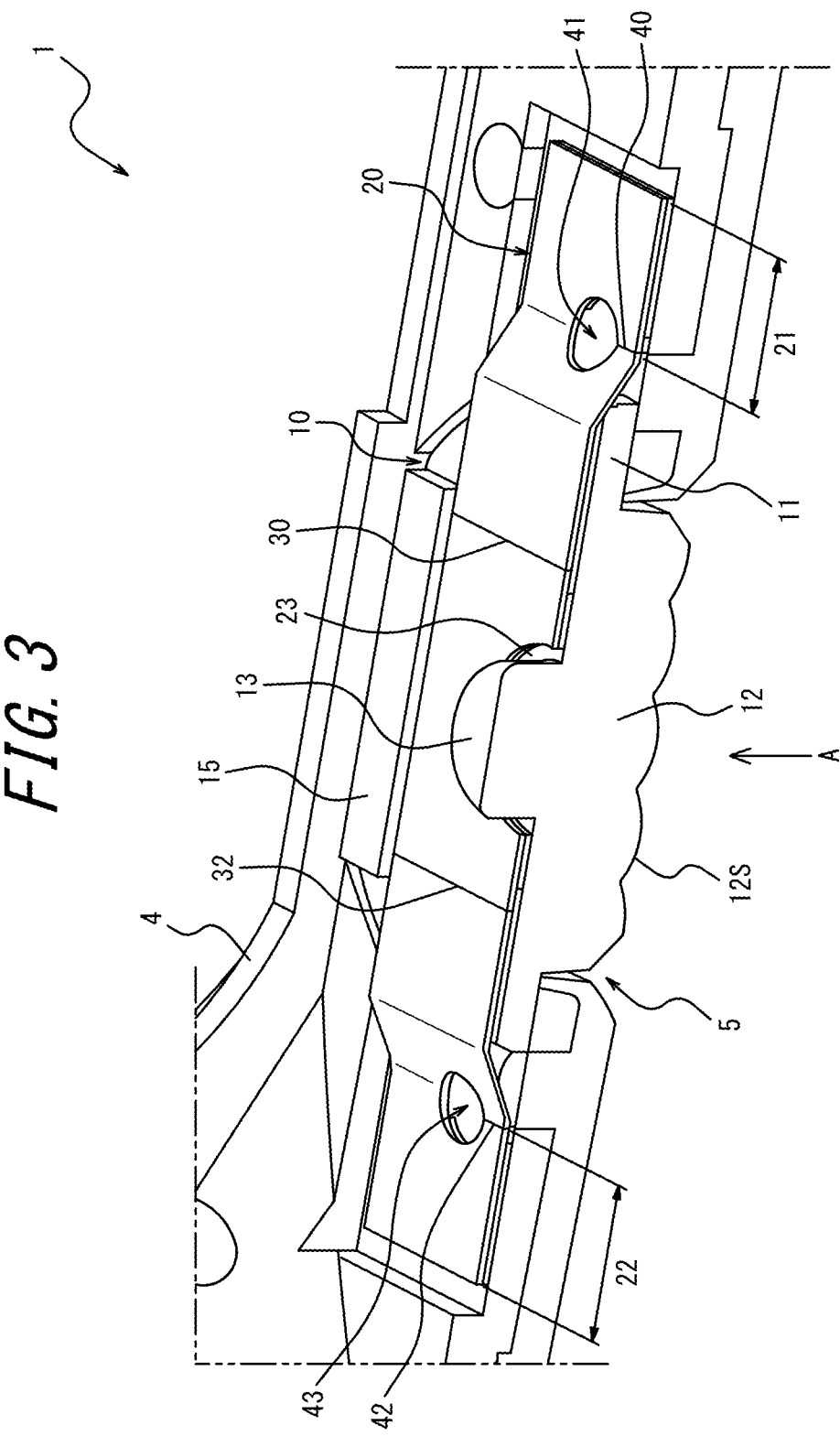
FIG. 3 is a cross-sectional perspective view taken along line III-III illustrated in FIG. 2.

As illustrated in FIG. 3, the key component 10 includes a body 11, an operation key 12, and a pusher 13. As illustrated in FIG. 2, the key component 10 includes an abutment section 14 and an abutment section 15.

Figure 4:
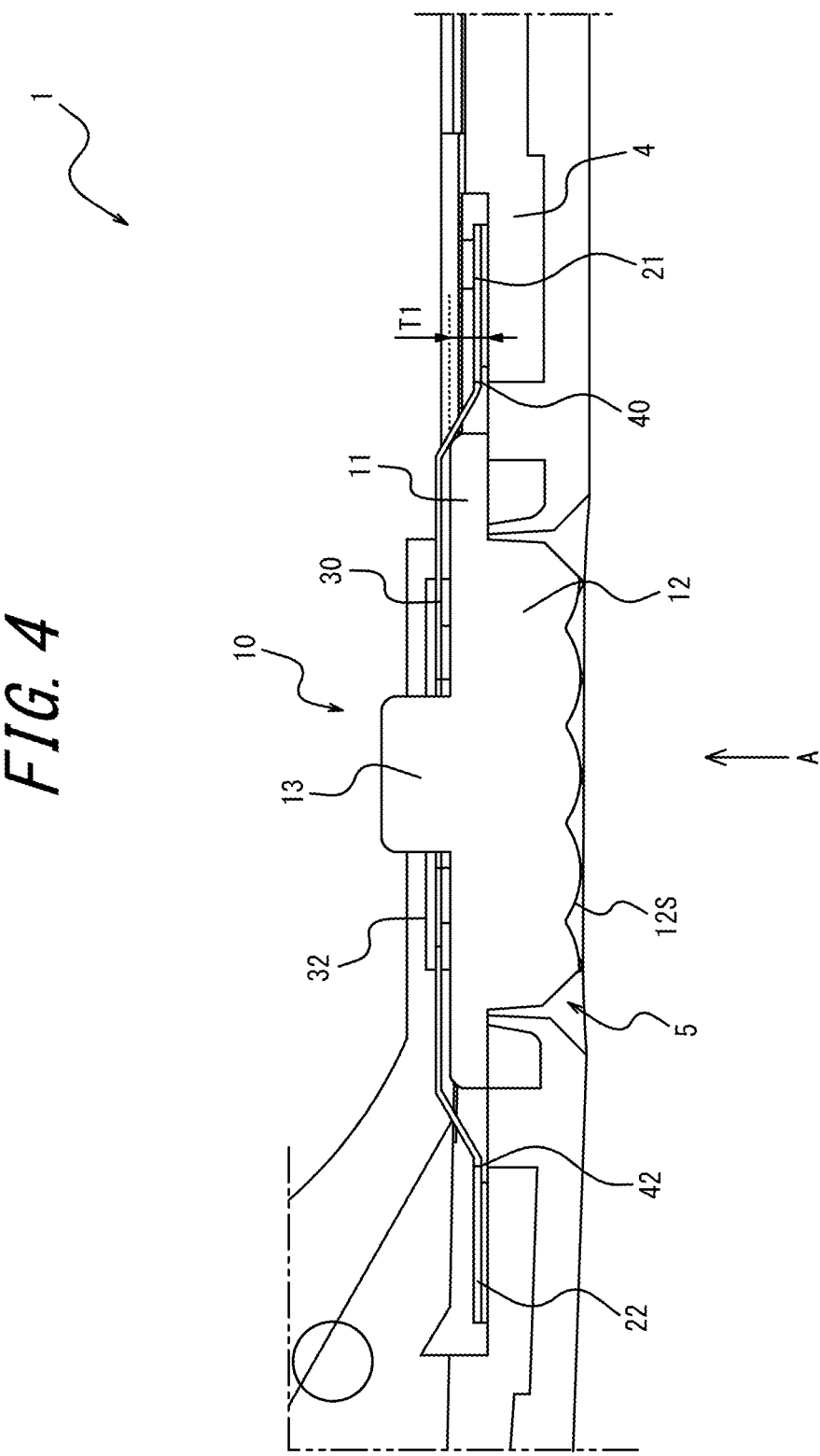
FIG. 4 is a cross-sectional view taken along line IV-IV illustrated in FIG. 2.

As illustrated in FIG. 3 and FIG. 4, the body 11 is tabular. By being tabular, the body 11 includes two surfaces opposite each other. Of the two surfaces of the body 11, the operation key 12 is located at one surface, whereas the pusher 13 is located at the other surface.

The body 11 illustrated in FIG. 4 may have a small thickness T1. The smaller the thickness T1, the more the securing component 20 is deformable in accordance movement of the key component 10 in the direction of the arrow A. The thickness T1 may be set based on a minimum value of the thickness permitted in the design of the key component 10. The thickness T1 may be the minimum value of the thickness permitted in the design of the key component 10.

The operation key 12 is pressed by the user. As illustrated in FIG. 3, the operation key 12 is located at the center or near the center of the body 11. The operation key 12 is located in the opening 5. The operation key 12 protrudes from the body 11. The operation key 12 has, for example, a protruding shape. Because the operation key 12 protrudes from the body 11, a surface 12S of the operation key 12 is exposed from the opening 5. The surface 12S is pressed by a finger of the user. When the user presses the surface 12S with his/her finger, the key component 10 moves in the direction of the arrow A. The surface 12S has an uneven shape in cross section, as illustrated in FIG. 3 and FIG. 4. The surface 12S having such an uneven shape can reduce the possibility of the user's finger sliding from the surface 12S.

Figure 5:
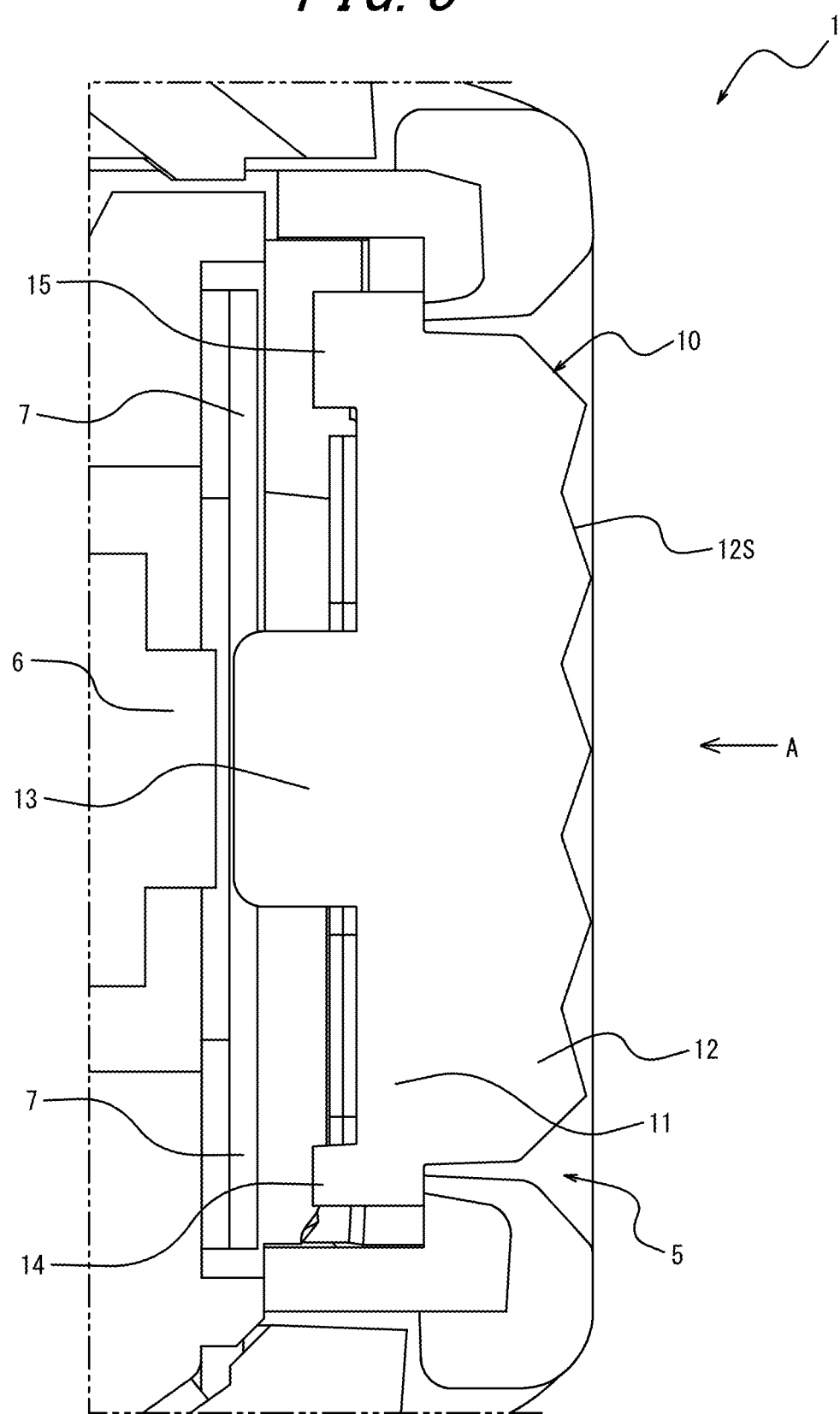
FIG. 5 is a cross-sectional view taken along line V-V illustrated in FIG. 2.

As illustrated in FIG. 3, the pusher 13 is located at the center or near the center of the body 11. The pusher 13 protrudes from the body 11 in a direction opposite from the protruding direction of the operation key 12. The pusher 13 has, for example, a protruding shape. The pusher 13 may be cylindrical. When the operation key 12 is pressed by a finger of the user, the pusher 13 moves together with the operation key 12 in the direction of the arrow A. The pusher 13 moving in the direction of the arrow A pushes a component 6 in the electronic device 1, as illustrated in FIG. 5.

As illustrated in FIG. 2, the abutment section 14 and the abutment section 15 protrude in the same direction as the protruding direction of the pusher 13. The abutment section 14 and the abutment section 15 are located on the surface, of the two surfaces of the body 11, where the pusher 13 is located. Each of the abutment section 14 and the abutment section 15 extends along a respective one of edges of the body 11. The abutment section 14 and the abutment section 15 are disposed with the pusher 13 interposed therebetween. When the operation key 12 is pressed by a finger of the user, each of the abutment section 14 and the abutment section 15 comes into abutment with a respective one of plate sections 7 inside the electronic device 1, as illustrated in FIG. 5. Because each of the abutment section 14 and the abutment section 15 comes into contact with the respective one of the plate sections 7 in the electronic device 1, the possibility of the user excessively pressing the operation key 12 can be reduced.

As illustrated in FIG. 6, the securing component 20 includes a securing section 21, a securing section 22, a through-hole 23, a first end 24, a second end 25, and a cutout 26. The securing component 20 includes a first slit 30 and an opening 31, a first slit 32 and an opening 33, a second slit 40 and an opening 41, and a second slit 42 and an opening 43.

As illustrated in FIG. 6, a direction extending from the through-hole 23 toward the securing section 21 is also referred to as "first direction D1". Alternatively, a direction extending from the through-hole 23 toward the securing section 22 instead of the securing section 21 may be defined as "first direction D1". If the securing component 20 is rectangular, the longitudinal direction of the securing component 20 may be defined as the first direction D1. A direction orthogonal to the first direction D1 is also referred to as "second direction D2". Alternatively, the second direction D2 may be a direction not orthogonal to the first direction D1. The second direction D2 may intersect the first direction D1. If the securing component 20 is rectangular, the lateral direction of the securing component 20 may be defined as the second direction D2.

The securing section 21 and the securing section 22 face each other in the first direction D1. The securing sections 21 and 22 extend in the second direction D2. The securing sections 21 and 22 may be ends of the securing component 20.

The securing sections 21 and 22 are secured to a member. In this embodiment, as illustrated in FIG. 3, the securing sections 21 and 22 are secured to the casing member 4. The securing sections 21 and 22 are secured to the casing member 4 by being bonded to the casing member 4 by using double-sided adhesive tape. Alternatively, the securing sections 21 and 22 may be secured to the casing member 4 by any method. The securing sections 21 and 22 may each have a size set based on the stress applied to the securing component 20.

As illustrated in FIG. 6, the pusher 13 is fitted in the through-hole 23. The through-hole 23 is located between the securing section 21 and the securing section 22 in the first direction D1. The through-hole 23 is located at the center or near the center of the securing component 20. The through-hole 23 is circular. Alternatively, the through-hole 23 may have any shape in accordance with the shape of the pusher 13.

The first end 24 and the second end 25 extend in the first direction D1. The first end 24 and the second end 25 are disposed with the through-hole 23 interposed therebetween.

The cutout 26 is formed by cutting out a portion of the second end 25. As illustrated in FIG. 2, the abutment section 14 protrudes from the cutout 26.

As illustrated in FIG. 6, the first slits 30 and 32 extend in the second direction D2 from the first end 24. The first slits 30 and 32 may extend linearly. The length of the first slit 30 and the length of the first slit 32 are equal to each other. Alternatively, the length of the first slit 30 and the length of the first slit 32 may be different from each other. The first slits 30 and 32 each have a width set based on the stress applied to the securing component 20. The width of the first slit 30 and the width of the first slit 32 may be equal to each other or may be different from each other.

The through-hole 23 is located between the first slit 30 and the first slit 32. The first slit 30 is located toward the securing section 21 relative to the through-hole 23. The first slit 32 is located toward the securing section 22 relative to the through-hole 23. When the key component 10 is secured to the casing member 4 by the securing component 20, the first slits 30 and 32 are located inward of the body 11 of the key component 10 in a top view illustrated in FIG. 6.

The opening 31 is located at the distal end of the first slit 30. The opening 33 is located at the distal end of the first slit 32. The openings 31 and 33 may each have a size set based on the stress applied to the securing component 20. The openings 31 and 33 are circular. Alternatively, the openings 31 and 33 may have any shape.

As illustrated in FIG. 6, the second slits 40 and 42 extend in the second direction D2 from the second end 25. The second slits 40 and 42 may extend linearly. The length of the second slit 40 and the length of the second slit 42 are equal to each other. Alternatively, the length of the second slit 40 and the length of the second slit 42 may be different from each other. The second slits 40 and 42 may each have a width set based on the stress applied to the securing component 20. The width of the second slit 40 and the width of the second slit 42 may be equal to each other or may be different from each other.

The through-hole 23 is located between the second slit 40 and the second slit 42. The second slit 40 is located toward the securing section 21 relative to the through-hole 23. The second slit 42 is located toward the securing section 22 relative to the through-hole 23. When the key component 10 is secured to the casing member 4 by the securing component 20, the second slits 40 and 42 are located outward of the body 11 of the key component 10 in the top view illustrated in FIG. 6. The second slit 40 is located at an end at the through-hole 23 side of the securing section 21. The second slit 42 is located at an end at the through-hole 23 side of the securing section 22.

The opening 41 is located at the distal end of the second slit 40. The opening 43 is located at the distal end of the second slit 42. The openings 41 and 43 may each have a size set based on the stress applied to the securing component 20. The openings 41 and 43 are circular. Alternatively, the openings 41 and 43 may have any shape.

The first slit 30 and the second slit 40 are adjacent to each other between the through-hole 23 and the securing section 21. As mentioned above, when the key component 10 moves in the direction of the arrow A, as illustrated in FIG. 2, the securing component 20 receives stress in the direction of the arrow A. With the first slit 30 and the second slit 40 being adjacent to each other, the securing component 20 can deform in a bellows-like manner between the through-hole 23 and the securing section 21 when the securing component 20 receives stress in the direction of the arrow A. For example, the first slit 30 and the second slit 40 can each act as a recess or a protrusion of the bellows-like shape, with the origin point being the first slit 30 located inward of the body 11 in the top view illustrated in FIG. 6. The securing component 20 deforming in a bellows-like manner reduces the possibility of breakage of the securing component 20.

The first slit 32 and the second slit 42 are adjacent to each other between the through-hole 23 and the securing section 22. As mentioned above, when the key component 10 moves in the direction of the arrow A, as illustrated in FIG. 2, the securing component 20 receives stress in the direction of the arrow A. With the first slit 32 and the second slit 42 being adjacent to each other, the securing component 20 can deform in a bellows-like manner between the through-hole 23 and the securing section 22 when the securing component 20 receives stress in the direction of the arrow A. For example, the first slit 32 and the second slit 42 can each act as a recess or a protrusion of the bellows-like shape, with the origin point being the first slit 32 located inward of the body 11 in the top view illustrated in FIG. 6. The securing component 20 deforming in a bellows-like manner reduces the possibility of breakage of the securing component 20.

A width W1 illustrated in FIG. 6 is a width by which the first slits 30 and 32 and the second slits 40 and 42 overlap each other in the second direction D2. The width W1 may be large. The larger the width W1, the more the securing component 20 is readily deformable in a bellows-like manner upon receiving stress in the direction of the arrow A.

The width W1 may be set based on a minimum value of a width W2 between the distal end of each of the second slits 40 and 42 and the first end 24. The minimum value of the width W2 may be the minimum value of the width W2 permitted in the design of the securing component 20. The minimum value of the width W2 may be set based on the durability of the securing component 20. The minimum value of the width W2 is, for example, about 20% of a width W20 of the securing component 20 in the second direction D2.

The width W1 may be set based on a minimum value of a width W3 between the distal end of each of the first slits 30 and 32 and the second end 25. The minimum value of the width W3 may be the minimum value of the width W3 permitted in the design of the securing component 20. The minimum value of the width W3 may be set based on the durability of the securing component 20. The minimum value of the width W3 is, for example, about 20% of the width W20 of the securing component 20 in the second direction D2.

The width W1 may be a value obtained by subtracting the minimum value of the width W2 and the minimum value of the width W3 from the width W20 of the securing component 20 in the second direction D2.

A length L1 illustrated in FIG. 6 is the length from the end at the through-hole 23 side of the securing section 21 in the first direction D1, that is, the second slit 40, to the body 11 of the key component 10. Furthermore, the length L1 is the length from the end of the securing section 22 in the first direction D1, that is, the second slit 42, to the body 11 of the key component 10. This length L1 may be large. The larger the length L1, the more the securing component 20 is bendable. The length L1 may be a maximum value set based on the stroke amount of the key component 10.

Accordingly, the securing component 20 according to this embodiment includes the first slits 30 and 32 and the second slits 40 and 42. The first slit 30 and the second slit 40 are adjacent to each other between the through-hole 23 and the securing section 21. The first slit 32 and the second slit 42 are adjacent to each other between the through-hole 23 and the securing section 22. According to this configuration, as mentioned above, the securing component 20 can deform in a bellows-like manner upon receiving stress in the direction of the arrow A, as illustrated in FIG. 2.

In this embodiment, the securing component 20 deforming in a bellows-like manner can reduce the possibility of breakage of the securing component 20, as compared with when the securing component 20 does not deform in a bellows-like manner. As a result, the securing component 20 has excellent durability.

In this embodiment, because the securing component 20 deforms in a bellows-like manner, the key component 10 can move in the direction of the arrow A even when the securing component 20 is not composed of rubber or the like. A component composed of rubber or the like stretches and is thus difficult to handle in a manufacturing process of the electronic device 1. In this embodiment, the securing component 20 may be composed of a material other than rubber, so that the securing component 20 can be handled more easily in the manufacturing process of the electronic device 1.

The securing component 20 deforming in a bellows-like manner makes the securing sections 21 and 22 less likely to delaminate from the casing member 4, as compared with when the securing component 20 does not deform in a bellows-like manner. With the securing sections 21 and 22 being less likely to delaminate from the casing member 4, the bonding area between the securing component 20 and the casing member 4 can be reduced. In other words, in this embodiment, the securing sections 21 and 22 can be reduced in size. According to this configuration, the securing component 20 can be reduced in size. As a result, the space for securing the key component 10 to the electronic device 1 can be reduced.

This embodiment can improve the technology for securing a physical key.

Furthermore, in this embodiment, the securing component 20 may further include the opening 31 at the distal end of the first slit 30. Moreover, the securing component 20 may further include the opening 33 at the distal end of the first slit 32. These openings 31 and 33 can alleviate stress concentrating at the distal ends of the first slits 30 and 32 when the securing component 20 deforms in a bellows-like manner. Alleviating the stress concentrating at the distal ends of the first slits 30 and 32 can reduce the possibility of breakage at the distal ends of the first slits 30 and 32. This configuration can further reduce the possibility of breakage of the securing component 20.

Furthermore, in this embodiment, the securing component 20 may further include the opening 41 at the distal end of the second slit 40. Moreover, the securing component 20 may further include the opening 43 at the distal end of the second slit 42. These openings 41 and 43 can alleviate stress concentrating at the distal ends of the second slits 40 and 42 when the securing component 20 deforms in a bellows-like manner. Alleviating the stress concentrating at the distal ends of the second slits 40 and 42 can reduce the possibility of breakage at the distal ends of the second slits 40 and 42. This configuration can further reduce the possibility of breakage of the securing component 20.

Furthermore, in this embodiment, the width W1 illustrated in FIG. 6 may be set based on the minimum value of the width W2. As mentioned above, the larger the width W1, the more the securing component 20 is readily deformable in a bellows-like manner upon receiving stress in the direction of the arrow A. The width W1 may be larger by being set based on the minimum value of the width W2, as compared with when the width W1 is not set based on the minimum value of the width W2. The width W1 being larger can reduce the possibility of breakage of the securing component 20.

Furthermore, in this embodiment, the length L1 illustrated in FIG. 6 may be a maximum value set based on the stroke amount of the key component 10. As mentioned above, the larger the length L1, the more the securing component 20 is bendable. The length L1 may be larger by being the maximum value set based on the stroke amount of the key component 10, as compared with when the length L1 is not the maximum value. The length L1 being larger makes the securing component 20 easily bendable. By being easily bendable, the securing component 20 can deform readily in a bellows-like manner upon receiving stress in the direction of the arrow A. Consequently, the length L1 being larger can reduce the possibility of breakage of the securing component 20.

First Modification

In the above embodiment, the securing component 20 is described as including two first slits and two second slits, as illustrated in FIG. 6. Alternatively, the securing component according to the present disclosure may include any number of first slits and any number of second slits. The larger the number of first slits and the number of second slits included in the securing component, the higher the degree of freedom of deformability for the securing component. The higher the degree of freedom of deformability for the securing component, the higher the durability of the securing component.

FIG. 7 illustrates a securing component 120 according to a first modification of the present disclosure. Similar to the securing component 20 described above, the securing component 120 includes the securing section 21, the securing section 22, the through-hole 23, the first end 24, the second end 25, and the cutout 26. Unlike the securing component 20 described above, the securing component 120 includes a first slit 130 and an opening 131, a first slit 132 and an opening 133, a first slit 134 and an opening 135, and a first slit 136 and an opening 137. Unlike the securing component 20 described above, the securing component 120 includes a second slit 140 and an opening 141, and a second slit 142 and an opening 143.

The first slits 130, 132, 134, and 136 extend in the second direction D2 from the first end 24. The first slits 130, 132, 134, and 136 may extend linearly. The first slits 130, 132, 134, and 136 have the same length. Alternatively, the first slits 130, 132, 134, and 136 may have different lengths. Of the first slits 130, 132, 134, and 136, one or more of the first slits may have a length different from the length of the remaining one or more of the first slits. The first slits 130, 132, 134, and 136 may each have a width set based on stress applied to the securing component 120. The first slits 130, 132, 134, and 136 may have the same width or different widths. Of the first slits 130, 132, 134, and 136, one or more of the first slits may have a width different from the width of the remaining one or more of the first slits.

The through-hole 23 is located between the first slits 130 and 132 and the first slits 134 and 136. The first slits 130 and 132 are located toward the securing section 21 relative to the through-hole 23. The first slits 134 and 136 are located toward the securing section 22 relative to the through-hole 23.

When the key component 10 is secured to the casing member 4 by the securing component 120, the first slits 130 and 134 are located inward of the body 11 of the key component 10 in a top view illustrated in FIG. 7. When the key component 10 is secured to the casing member 4 by the securing component 120, the first slits 132 and 136 are located outward of the body 11 of the key component 10 in the top view illustrated in FIG. 7. The first slit 132 is located at the end at the through-hole 23 side of the securing section 21. The first slit 136 is located at the end at the through-hole 23 side of the securing section 22.

The openings 131, 133, 135, and 137 are located at the distal ends of the first slits 130, 132, 134, and 136, respectively. The openings 131, 133, 135, and 137 may each have a size set based on the stress applied to the securing component 120. The openings 131, 133, 135, and 137 are circular. Alternatively, the openings 131, 133, 135, and 137 may have any shape.

The second slits 140 and 142 extend in the second direction D2 from the second end 25. The second slits 140 and 142 may extend linearly. The length of the second slit 140 and the length of the second slit 142 are equal to each other. Alternatively, the length of the second slit 140 and the length of the second slit 142 may be different from each other. The second slits 140 and 142 may each have a width set based on the stress applied to the securing component 120. The width of the second slit 140 and the width of the second slit 142 may be equal to each other or may be different from each other.

The through-hole 23 is located between the second slit 140 and the second slit 142. The second slit 140 is located toward the securing section 21 relative to the through-hole 23. The second slit 142 is located toward the securing section 22 relative to the through-hole 23. When the key component 10 is secured to the casing member 4 by the securing component 120, the second slits 140 and 142 are located inward of the body 11 of the key component 10 in the top view illustrated in FIG. 7.

The openings 141 and 143 are located at the distal ends of the second slits 140 and 142, respectively. The openings 141 and 143 may each have a size set based on the stress applied to the securing component 120. The openings 141 and 143 are circular. Alternatively, the openings 141 and 143 may have any shape.

The first slit 130 and the second slit 140 are adjacent to each other between the through-hole 23 and the securing section 21. The second slit 140 and the first slit 132 are adjacent to each other between the through-hole 23 and the securing section 21. In other words, the first slit 130, the second slit 140, and the first slit 132 are arranged in the first direction D1 between the through-hole 23 and the securing section 21 in the following order: the first slit 130, the second slit 140, and the first slit 132. According to this configuration, the securing component 120 is the same as or similar to the securing component 20 in that the securing component 120 can deform in a bellows-like manner between the through-hole 23 and the securing section 21 upon receiving stress in the direction of the arrow A. Furthermore, the securing component 120 including a larger number of first slits than the securing component 20 can deform more readily in a bellows-like manner.

The first slit 134 and the second slit 142 are adjacent to each other between the through-hole 23 and the securing section 22. The second slit 142 and the first slit 136 are adjacent to each other between the through-hole 23 and the securing section 22. In other words, the first slit 134, the second slit 142, and the first slit 136 are arranged in this order in a direction opposite the first direction D1 between the through-hole 23 and the securing section 22. According to this configuration, the securing component 120 is the same as or similar to the securing component 20 in that the securing component 120 can deform in a bellows-like manner between the through-hole 23 and the securing section 22 upon receiving stress in the direction of the arrow A. Furthermore, the securing component 120 including a larger number of first slits than the securing component 20 can deform more readily in a bellows-like manner.

Other configurations and advantages of the securing component 120 according to the first modification are the same as or similar to those of the securing component 20 according to the above embodiment.

Second Modification

FIG. 8 illustrates a securing component 220 according to a second modification of the present disclosure. Similar to the securing component 20 described above, the securing component 220 includes the securing section 21, the securing section 22, the through-hole 23, the first end 24, the second end 25, the cutout 26, the first slit 30 and the opening 31, and the second slit 40 and the opening 41. Unlike the securing component 20 described above, the securing component 220 includes a first slit 232 and an opening 233, and a second slit 242 and an opening 243.

The first slit 232 extends in the second direction D2 from the first end 24. The first slit 232 may extend linearly. The length of the first slit 232 and the length of the second slit 40 may be equal to each other. Alternatively, the length of the first slit 232 and the length of the second slit 40 may be different from each other. The first slit 232 may have a width set based on stress applied to the securing component 220. The width of the first slit 232 may be equal to the width of the second slit 40 or may be different from the width of the second slit 40.

The through-hole 23 is located between the first slit 30 and the first slit 232. The first slit 132 is located toward the securing section 22 relative to the through-hole 23. When the key component 10 is secured to the casing member 4 by the securing component 220, the first slit 132 is located outward of the body 11 of the key component 10 in a top view illustrated in FIG. 8. The first slit 132 is located at an end at the through-hole 23 side of the securing section 22.

The opening 233 is located at the distal end of the first slit 232. The size of the opening 233 may be equal to the size of the opening 41.

The second slit 242 extends in the second direction D2 from the second end 25. The second slit 242 may extend linearly. The length of the second slit 242 and the length of the first slit 30 are equal to each other. Alternatively, the length of the second slit 242 and the length of the first slit 30 may be different from each other. The second slit 242 may have a width set based on the stress applied to the securing component 220. The width of the second slit 242 may be equal to the width of the first slit 30 or may be different from the width of the first slit 30.

The through-hole 23 is located between the second slit 40 and the second slit 242. The second slit 242 is located toward the securing section 22 relative to the through-hole 23. When the key component 10 is secured to the casing member 4 by the securing component 220, the second slit 242 is located inward of the body 11 of the key component 10 in the top view illustrated in FIG. 8.

The opening 243 is located at the distal end of the second slit 242. The size of the opening 243 may be equal to the size of the opening 31.

The first slit 232 and the second slit 242 are adjacent to each other between the through-hole 23 and the securing section 22. According to this configuration, the securing component 220 is the same as or similar to the securing component 20 illustrated in FIG. 6 in that the securing component 220 can deform in a bellows-like manner between the through-hole 23 and the securing section 22 upon receiving stress in the direction of the arrow A.

Other configurations and advantages of the securing component 220 according to the second modification are the same as or similar to those of the securing component 20 according to the above embodiment.

Although the embodiment according to the present disclosure has been described based on the drawings and practical examples, various alternative embodiments and variations are possible to a skilled person based on the present disclosure. Therefore, it is to be noted that these alternative embodiments and variations are included in the scope of the present disclosure. For example, the functions and the like included in the respective components are relocatable so as not to logically conflict with each other, and a plurality of components may be combined into one or may be divided. It is to be noted that these are also included in the scope of the present disclosure.

The terms "first", "second", and the like in the present disclosure are identifiers for differentiating the relevant components from each other. With regard to the components differentiated from each other using the terms "first", "second", and the like in the present disclosure, the numbers of the components are interchangeable. For example, with regard to the first slits, the identifiers "first" and "second" are interchangeable with the second slits. The identifiers are interchanged with each other at the same time. The components are differentiated from each other even after the identifiers are interchanged. The identifiers may be deleted. Components having the identifiers deleted therefrom are differentiated from each other using reference signs. The identifiers alone, such as "first", "second", and the like, in the present disclosure are not to be used for interpreting the sequence of the components or as grounds for existence of an identifier having a smaller number.

(1) A securing component according to an embodiment includes:
a first securing section secured to a member;
a through-hole into which a pusher of a key component is inserted;
a first end extending in a first direction, the first direction extending from the through-hole toward the first securing section;
a second end extending in the first direction, the second end opposite to the first end through the through-hole;
at least a first slit extending in a second direction from the first end, the second direction crossing the first direction; and
at least a second slit extending in the second direction from the second end.

The at least a first slit and the at least a second slit are disposed between the through-hole and the first securing section, and the at least a first slit is next to the at least a second slit.

(2) The securing component according to (1) may further include an opening at a distal end of the at least a first slit.

(3) The securing component according to (1) or (2) may further include an opening at a distal end of the at least a second slit.

(4) In the securing component according to any one of (1) to (3), the at least a first slit may include two first slits, and the through-hole may be located between one of the two first slits and the other.

(5) In the securing component according to any one of (1) to (4), the at least a second slit may include two second slits, and the through-hole may be located between one of the two second slits and the other.

(6) In the securing component according to any one of (1) to (5), the securing component may include a second securing section, and the through-hole may be located between the first securing section and the second securing section.

(7) In the securing component according to any one of (1) to (6), the at least a first slit may include two or more first slits, and the at least a second slit may include two or more second slits. The key component may include a body.

Either one of the two or more first slits or one of the two or more second slits that is located toward the through-hole may be located inward of the body in a top view, and either one of the two or more first slits or one of the two or more second slits that is located toward the first securing section may be located outward of the body in the top view.

(8) In the securing component according to any one of (1) to (7), a width by which the at least a first slit and the at least a second slit overlap each other in the second direction may be set based on a minimum value of a width between a distal end of the at least a second slit and the first end.

(9) In the securing component according to any one of (1) to (8), the key component may include a body, and a length from an end at a through-hole side of the first securing section to the body may be a maximum value set based on a stroke amount of the key component.

(10) An electronic device according to an embodiment includes a securing component.

The securing component includes:
a securing section secured to a member;
a through-hole into which a pusher of a key component is inserted;
a first end extending in a first direction, the first direction extending from the through-hole toward the securing section;
a second end extending in the first direction, the second end opposite to the first end through the through-hole;
a first slit extending in a second direction from the first end, the second direction crossing the first direction; and
a second slit extending in the second direction from the second end.

The first slit and the second slit are disposed between the through-hole and the securing section, and the first slit is next to the second slit.

(11) The electronic device according to (10) may further include the key component.

The key component may include:
an operation key;
the pusher movable together with the operation key when the operation key is pressed; and
an abutment section configured to come into abutment with a plate section inside the electronic device when the operation key is pressed.

(12) In the electronic device according to (10) or (11), the key component may further include a body.

A thickness of the body may set based on a minimum value of a thickness permitted in a design of the key component.

What is claimed is:
1. A securing component comprising:
a first securing section secured to a member;
a through-hole into which a pusher of a key component is inserted;
a first end extending in a first direction, the first direction extending from the through-hole toward the first securing section;
a second end extending in the first direction, the second end opposite to the first end through the through-hole;
at least a first slit extending in a second direction from the first end, the second direction crossing the first direction; and
at least a second slit extending in the second direction from the second end,
wherein the at least a first slit and the at least a second slit are disposed between the through-hole and the first securing section, and the at least a first slit is next to the at least a second slit.

2. The securing component according to claim 1, further comprising:
an opening at a distal end of the at least a first slit.

3. The securing component according to claim 1, further comprising:
an opening at a distal end of the at least a second slit.

4. The securing component according to claim 1,
wherein the at least a first slit comprises two first slits, and
wherein the through-hole is located between one of the two first slits and another one of the two first slits.

5. The securing component according to claim 1,
wherein the at least a second slit comprises two second slits, and
wherein the through-hole is located between one of the two second slits and the other one of the two second slits.

6. The securing component according to claim 1, further comprising a second securing section, wherein the through-hole is located between the first securing section and the second securing section.

7. The securing component according to claim 1, wherein the at least a first slit comprises two or more first slits, the at least a second slit comprises two or more second slits,
the key component comprises a body,
either one of the two or more first slits or one of the two or more second slits that is located toward the through-hole is located inward of the body in a top view, and either one of the two or more first slits or one of the two or more second slits that is located toward the first securing section is located outward of the body in the top view.

8. The securing component according to claim 1, wherein a width by which the at least a first slit and the at least a second slit overlap each other in the second direction is set based on a minimum value of a width between a distal end of the at least a second slit and the first end.

9. The securing component according to claim 1, wherein the key component comprises a body, and a length from an end at a through-hole side of the first securing section to the body is a maximum value set based on a stroke amount of the key component.

10. An electronic device comprising:
a securing component,
wherein the securing component comprises:
   a securing section secured to a member;
   a through-hole into which a pusher of a key component is inserted;
   a first end extending in a first direction, the first direction extending from the through-hole toward the securing section;
   a second end extending in the first direction, the second end opposite to the first end through the through-hole;
   a first slit extending in a second direction from the first end, the second direction crossing the first direction; and
   a second slit extending in the second direction from the second end,
   wherein the first slit and the second slit are disposed between the through-hole and the securing section, and the first slit is next to the second slit.

11. The electronic device according to claim 10, further comprising:
the key component,
wherein the key component comprises:
   an operation key;
   the pusher movable together with the operation key when the operation key is pressed; and
   an abutment section configured to come into abutment with a plate section inside the electronic device when the operation key is pressed.

12. The electronic device according to claim 10, wherein the key component further comprises a body, and wherein a thickness of the body is set based on a minimum value of a thickness permitted in a design of the key component.

* * * * *